(12) United States Patent
Matsui (10) Patent No.: US 6,670,995 B1
(45) Date of Patent: Dec. 30, 2003

(54) PHASE-LOCKED LOOP CIRCUIT FOR HORIZONTAL SYNCHRONIZATION SIGNAL

(75) Inventor: Toshiya Matsui, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 422 days.

(21) Appl. No.: 09/643,254

(22) Filed: Aug. 22, 2000

(30) Foreign Application Priority Data

Aug. 23, 1999 (JP) ............................................ 11-235876

(51) Int. Cl.[7] .............................. H03L 7/00; H03L 7/06; H03D 3/24; H04B 7/00
(52) U.S. Cl. ........................ 348/540; 348/536; 348/541; 327/156; 455/260; 375/376
(58) Field of Search ................................. 348/540, 536, 348/537, 541, 542, 543, 544; 327/156, 157, 158, 159; 455/260; 375/376; H03L 7/00, 7/06; H03D 3/24; H04B 7/00

(56) References Cited

U.S. PATENT DOCUMENTS

| 4,611,230 A | * | 9/1986 | Nienaber | 348/511 |
| 5,410,572 A | * | 4/1995 | Yoshida | 375/376 |
| 5,565,928 A | * | 10/1996 | Saeger et al. | 348/540 |
| 5,767,916 A | * | 6/1998 | West | 348/537 |
| 5,912,713 A | * | 6/1999 | Tsunoda et al. | 348/540 |
| 5,956,378 A | * | 9/1999 | Soda | 375/376 |
| 6,038,276 A | * | 3/2000 | Dinh | 375/376 |
| 6,342,818 B1 | * | 1/2002 | Segawa et al. | 331/14 |

FOREIGN PATENT DOCUMENTS

| JP | 6-253169 | 9/1994 |
| JP | 6-339043 | 12/1994 |
| JP | 10-1998-0701064 | 2/1998 |
| JP | 1998-034762 | 8/1998 |
| JP | WO97/07594 | 9/1998 |
| KR | 11-73739 | 3/1999 |

* cited by examiner

Primary Examiner—John Miller
Assistant Examiner—Brian Yenke
(74) Attorney, Agent, or Firm—Whitham, Curtis & Christofferson, P.C.

(57) ABSTRACT

A PLL circuit according avoids any large change in a frequency in a VCO (5) even if an input horizontal synchronization signal suddenly changes or a level of the frequency decreases to a predetermined value or less, or disappears. The PLL circuit comprises a switch (3) to be provided on an output side of a phase comparator (2) to control an output voltage of the VCO by connecting to an AFC filter (4) and supplying a phase difference current according to a phase difference, during the time the horizontal synchronization signal is supplied. The comparator (2) compares a phase of an Hin signal through a delay circuit (1) with a phase of a return (RET) signal through a dividing circuit (6) and a delay circuit (7) from the VCO. With this structure, the comparator does not supply any phase difference current and does not make the VCO change at the time when the Hin signal is disappeared. The comparator controls the VCO by means of supplying the phase difference current to have a time length according to a pulse width of the Hin signal or less for a higher frequency of the Hin signal and according to a delay time length given by the delay circuit (1) for a lower frequency of the Hin signal.

6 Claims, 6 Drawing Sheets

FIG. 7

PHASE-LOCKED LOOP CIRCUIT FOR HORIZONTAL SYNCHRONIZATION SIGNAL

FIELD OF THE INVENTION

This invention relates to a phase-locked loop (PLL) circuit for a horizontal synchronization signal comprising a voltage-controlled oscillator (VCO) and a phase comparator. The phase comparator compares a phase of an input horizontal synchronization signal with a phase of a return (RET) signal to be fed back from the VCO and detects a phase difference value obtained by the result of the comparison and sent to the VCO. The RET signal is divided from a signal to be output from the VCO to a frequency capable of synchronizing with the horizontal synchronization signal. In accordance with the phase difference value, the PLL circuit locks both phases to maintain a synchronous condition. Specifically, the invention relates to the PLL circuit capable of avoiding any rapid change of the output frequency of the VCO even if the frequency level of the input horizontal synchronization signal is deteriorated to the level less than an appointed value, or disappears.

BACKGROUND OF THE INVENTION

In the recent years, a multiscan display applied to a wide frequency of the input synchronization signal is generally used. This brings about a necessity of the PLL circuit for the horizontal synchronization signal to cope with such requirements. Such PLL circuit is generally used for a television set or the like. However, an output circuit of the horizontal synchronization signal has a tendency to fail due to a rapid change of a frequency.

This is because, in the case where the frequency of pulses driving the output circuit of the horizontal synchronization signal changes rapidly, a high-voltage-proof transistor of a driver circuit breaks down. For example, there is a case that the frequency changes by about 10 percent in an instant, i.e., the case that the horizontal synchronization signal changes rapidly or disappears. In this event, the PLL circuit judges the disappearance as a large decrease of the frequency and tries to instantly cope with the change such that a rapid increase of the frequency should be executed and, as a result, the output circuit of the horizontal synchronization signal fails.

Figure 1:
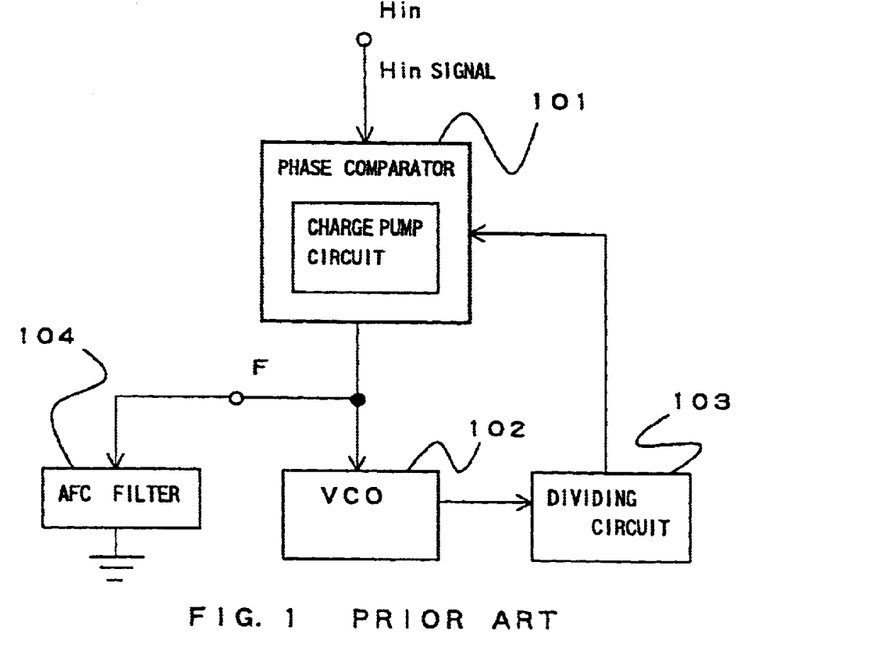
FIG. 1 shows a block diagram of a conventional PLL circuit.

An existing PLL circuit of this type shown in FIG. 1, for example, connects serially a phase comparator 101, a VCO 102, and a dividing circuit 103 so as to form a loop. The phase comparator 101 compares the phases of an Hin (horizontal synchronized input) signal received from a terminal Hin with the RET signal from dividing circuit 103 and outputs a phase difference value to the VCO 102 from a charge pump circuit therein. To the input of the VCO 102, an AFC filter (filter for Automatic Frequency Control) 104 also connects through a terminal F. By such a construction, the dividing circuit 103 divides the output frequency from the VCO 102 to the same frequency with the Hin signal from the terminal Hin. Following this, a phase synchronization between the Hin and the RET signals are maintained by a lock.

Figure 2:
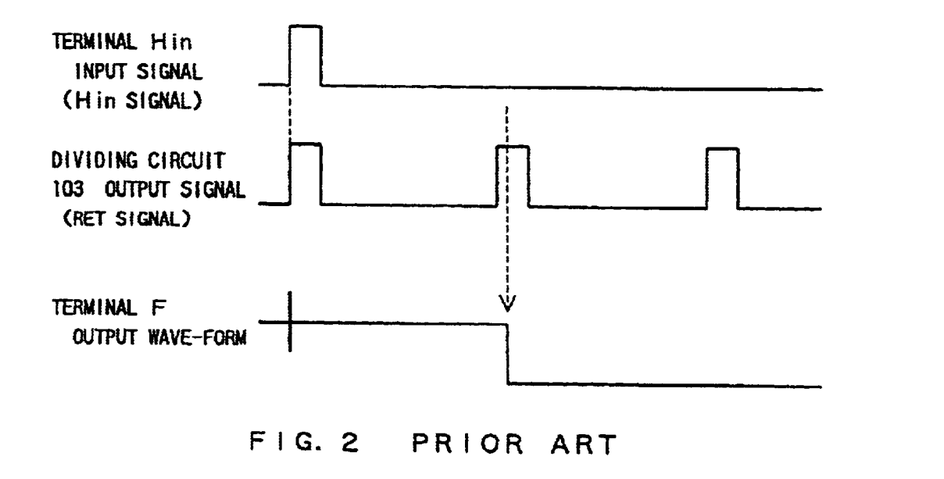
FIG. 2 shows a time-chart showing a condition in which a Hin signal has suddenly disappeared.

Referring to FIG. 2 of a time chart and FIG. 1, description will be made about a case where the input of the Hin signal is disappeared.

Normally, both the Hin and the RET signals are locked at substantially equal phases. Accordingly, the edge timings of the waves in both signals are almost equal and a wave form sent from the charge pump, circuit of the phase comparator 101 is almost none, or an extrafine pulse in the terminal F.

On the other hand, in a case that there is no Hin signal in spite of existance of the RET signal, the comparator 101 follows the generation of the RET signal to supply a current continuously from the charge pump circuit to the AFC filter 104. Accordingly, the VCO 102 judges it as a large decrease of the frequency and changes a performance so as to increase rapidly the output frequency. As a result, an output circuit for the horizontal synchronization signal would fail.

In order to resolve such problems, the following proposals are disclosed. For example, a switch supplied to an input side of a VCO is disclosed in Japanese Patent No. 2511858. In this prior art, the switch connects a reference voltage source to the VCO at a time when a comparator detects an Hin signal to disappear or any phase difference value to exceed a predetermined value. On the other hand, Japanese Unexamined Patent Applications (JP-A) Nos. H6-253169 and No. H6-339043 disclose a method of keeping a central mean voltage or an error margin voltage in a condition where no phase difference is occurred, and to supply the voltage at a time when any phase difference occurs.

However, even if such switch are supplied, the above-described disadvantageous phenomenon can not be erased at all during the time from a disappearance of the Hin signal or an occurrence of the phase difference exceeding the predetermined value until switching completion operated by the switch. A timing of the switching corresponds to an operation of the switch after the detection of any one of them. Accordingly, the above-described existing PLL circuit for the horizontal synchronization signal has a problem such as a possibility of failure of a circuit which outputs the horizontal synchronizing signal when a disappearance of the Hin signal or any occurrence of phase difference exceeding the predetermined value has occurred.

The reason is as follows. Even in a case where there is no input of the Hin signal or where the large delay is occurred despite of the supply of the RET signal, a comparator supplies a phase difference current continuously from the charge pump circuit to the AFC filter in response to the generation of the RET signal. This causes a rapid change of an output frequency from the VCO. Moreover, even such switch is installed, the above-mentioned problem can not be avoided in passing time after the occurrence of the above-described condition until a detection of the condition and a drive of the switch.

SUMMARY OF THE INVENTION

It is therefore an object of the present invention to provide a phase-locked loop (PLL) circuit for the horizontal synchronization signal capable of avoiding a signal change for the VCO even when Hin signal is not supplied or a large delay has occurred despite the input of the RET signal.

A phase-locked loop (PLL) circuit for horizontal synchronization signal according to a present invention comprises a voltage-controlled oscillator (VCO), a phase comparator and a switch. The phase comparator compares a phase of an input horizontal synchronization signal with a phase of a return (RET) signal fed back from the VCO, and detects a phase difference value obtained by the above comparison and sent to the VCO. The RET signal from the VCO is divided into frequencies so as to be phase-comparable with a horizontal synchronization signal. In accordance with the phase difference value, the PLL circuit locks phases to maintain a synchronous condition of the phases. Specifically, in the output side of the comparator, a switch connects the detected phase difference value to the VCO during the horizontal synchronization signal is supplied.

As the above-mentioned composition gives the phase difference value to the VCO only during input of the horizontal synchronization signal, it is nothing that the VCO receives the phase difference value even if it brings about such abnormal condition of phase comparing as to input no horizontal synchronization signal. By this condition, the VCO has a judgment of no occurrence of the phase difference, and the oscillation of the VCO is continued as well as until then. As a result, it is capable of prevention of sudden change for a frequency of pulses to drive a circuit to output the horizontal synchronization signal.

Further provided with a first delay circuit, the horizontal synchronization signal is inputted and provided with a predetermined delay time thereto so as to be transmitted to the phase comparator. Accordingly, it is able to transmit the phase difference value with the delay time to the VCO. Moreover, provided with a second delay circuit to be supplied with the RET signal, the RET signal is provided with a predetermined delay time with the same value as the above-mentioned delay time of the first delay circuit, and then outputted to the phase comparator. As a result, it is able to simplify a phase comparison circuit in the phase comparator.

DESCRIPTION OF THE PREFERRED EMBODIMENT

Now, a preferred embodiment of the present invention will be described with reference to the accompanying drawings to explain the present invention in detail.

Figure 3:
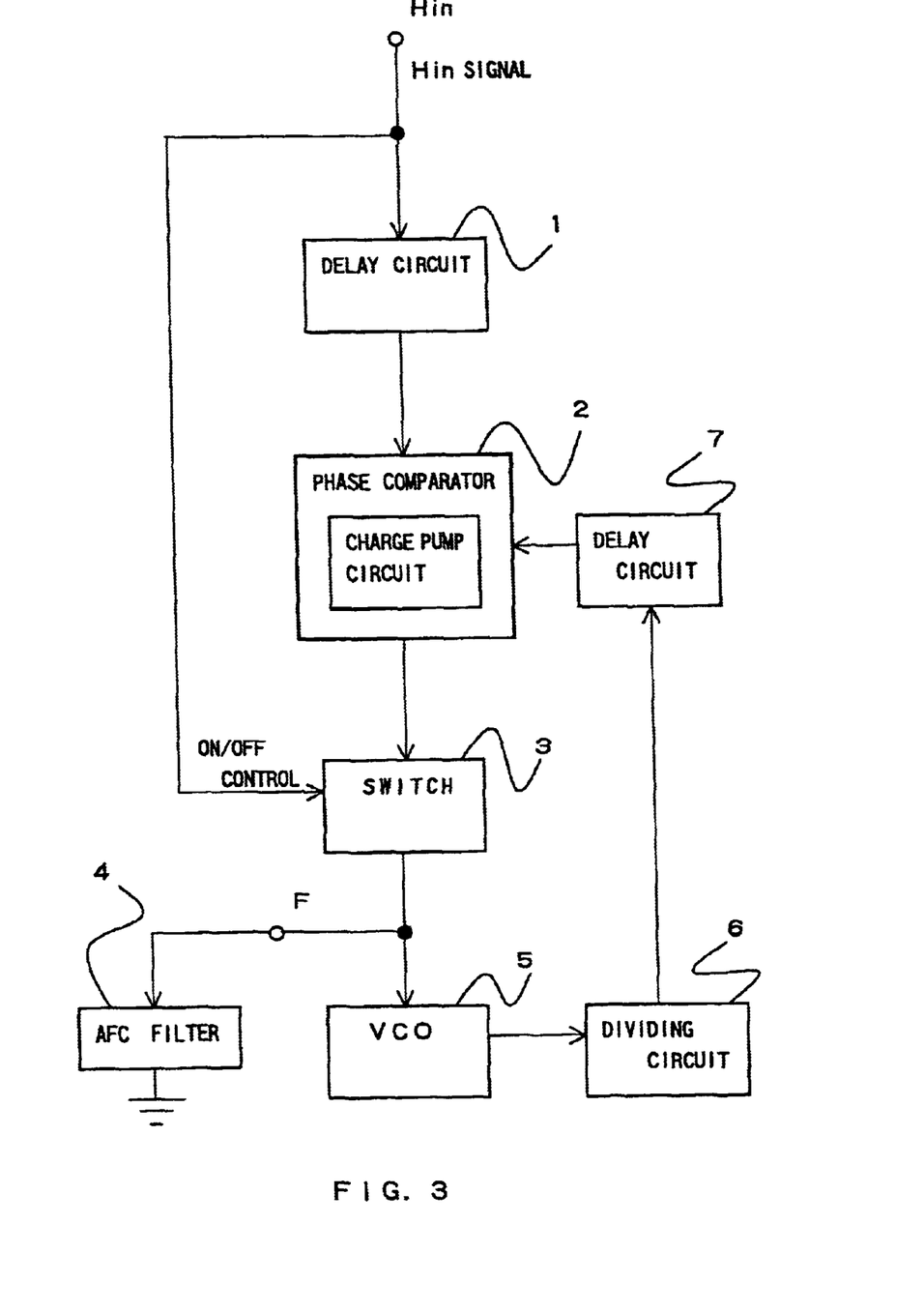
FIG. 3 shows a block diagram of a PLL circuit according to an embodiment of this invention.

Referring to FIG. 3, a PLL circuit for the horizontal synchronization signals according to the present invention comprises delay circuits 1 and 7, a phase comparator 2 with a charge pump circuit, a switch 3, an AFC filter 4 connected to terminal F, a VCO 5, and a dividing circuit 6.

The delay circuit 1 inputs a Hin (horizontal synchronized input) signal to be given a predetermined delay time, for example 100 nsec, and to be outputted to the phase comparator 2. The delay circuit 7 inputs a RET (return) signal outputted from the dividing circuit 6 and given the predetermined delay time, for example 100 nsec, the same as that of the delay circuit 1, and outputs it to the phase comparator 2.

The phase comparator 2 inputs both the Hin signal and the RET signal having the same delay time 100 nsec given by delay circuits 1 and 7, respectively, and compares by a rising edge or a falling edge of the signal pulse. Then, the phase comparator 2 outputs a phase difference value as a phase difference value according to phase advance and phase lag by a positive pulse and a negative pulse respectively from the charge pump circuit. As a result, a phase difference current flows by the AFC filter 4 connected to the terminal F.

The switch 3 receives the Hin signal through the terminal Hin and connects an output from the phase comparator 2 to an input of the VCO 5 as an ON signal only during the input of the Hin signal. Accordingly, in case where no Hin signal to be inputted, there will be no output from the switch 3 and the switch 3 is fixed in high impedance.

The AFC filter 4 is connected to both the output of the switch 3 and the input of the VCO 5 through the terminal F. And the AFC filter 4 supplies the phase difference current, corresponding to the output from the phase comparator 2 through the switch 3, to be transmitted to the VCO 5 by voltage wave form.

The VCO 5 adjusts the oscillation frequency in accordance with the voltage value to be supplied in response to the output received from the phase comparator 2 through the switch 3 and then output it to the dividing circuit 6. The dividing circuit 6 divides the output frequency from the VCO 5 until the frequency becomes the as same the frequency as the frequency of the Hin signal and then outputs it as the RET signal to the delay circuit 7.

By connecting the output from the delay circuit 7 to the phase comparator 2, the comparison result in the phase comparator 2 reflects to the VCO 5 and then the PLL circuit completes the process of synchronously locking the Hin signal with the phase of the RET signal.

Figure 4:
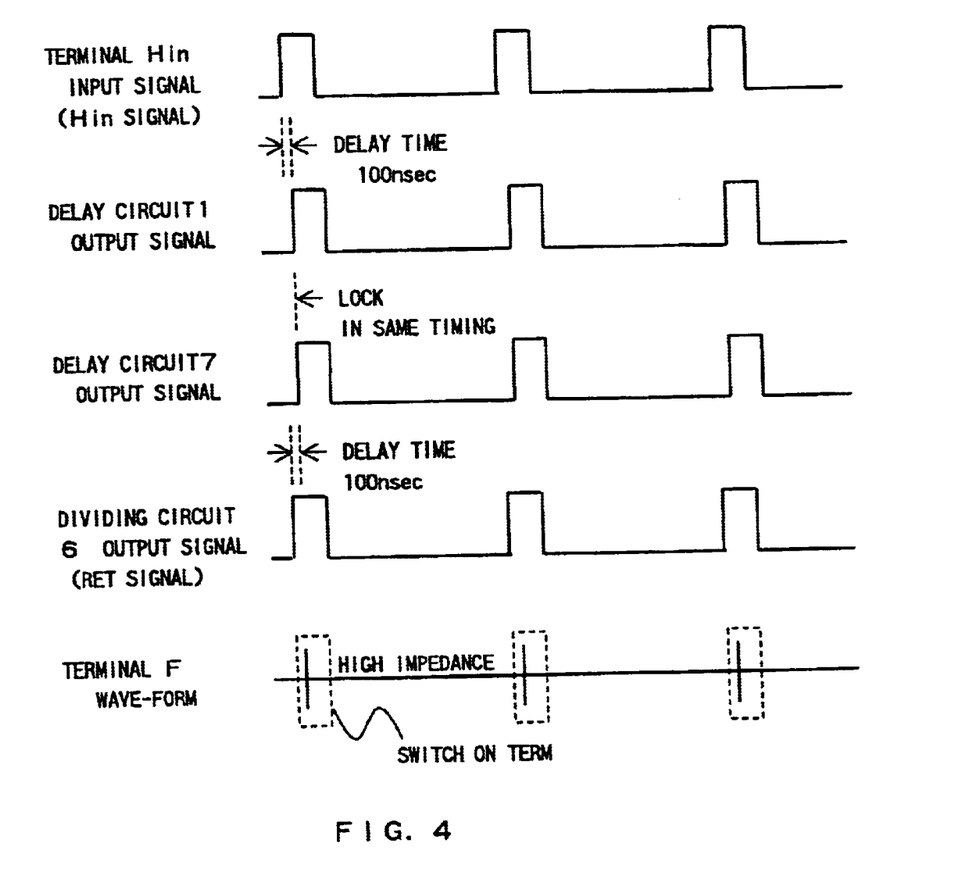
FIG. 4 shows a time-chart of a normal condition in FIG. 3.

Referring to FIGS. 3 and 4, description will be made about the normal condition of the phase which is normally locked.

In the normal condition in FIG. 3, both the Hin signal inputted from the terminal Hin and the RET signal outputted from the dividing circuit 6 have both passed the delay circuits 1 and 7 to have the same delay time 100 nsec. Accordingly, each of the Hin signal passed through the delay circuit 1 and the RET signal passed through the delay circuit 7 has a phase which accord synchronously with each other by the PLL circuit and has the same rising edges.

Referring to FIG. 4, the switch 3 runs the phase difference current detected by the phase comparator 2 only during a term of the pulse width of the Hin signal shown by dashed lines. Accordingly, in case where the phases accord with each other, there will be almost no phase difference current flow.

Figure 5:
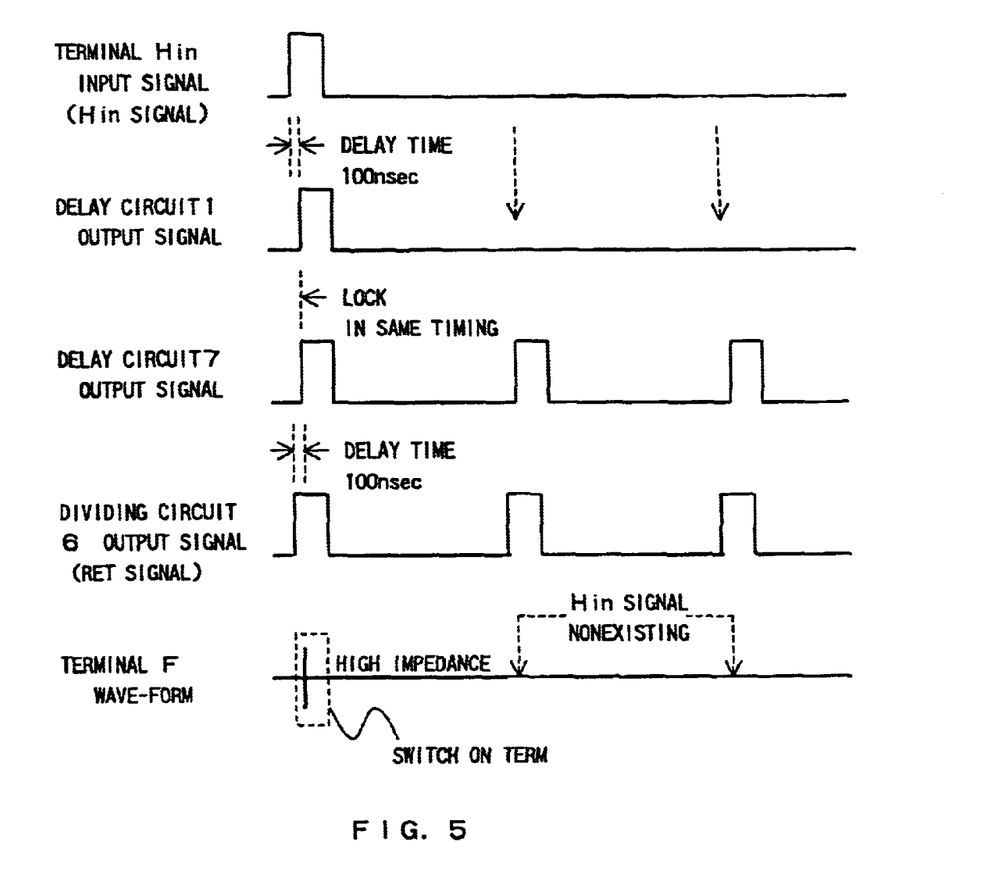
FIG. 5 shows a time-chart of a condition of a case that an Hin signal has suddenly disappeared in FIG. 3.

Referring to FIGS. 3 and 5, a case of disappearance of the Hin signal will be described below. The figures show the case in which the normal condition indicative of the coincidence of the phases has been rapidly changed to the condition indicative of the disappearance of the Hin signal.

In this condition, since there is no Hin signal, the switch 3 turns off the charge pump circuit of the phase comparator 2 and the AFC filter 4. Accordingly, a charge for the phase difference value stored in the AFC filter 4 continues to be retained. That is, even if the Hin signal disappears, the oscillation frequency of the VCO 5 continuously maintains the present condition. The rapid change of the frequency therefore does not occur.

In other words, a switch which is controlled by the Hin signal is provided on the output side of the phase comparator serves to prevent the rapid change of the frequency of the VCO even if the Hin signal is disappeared.

Figure 6:
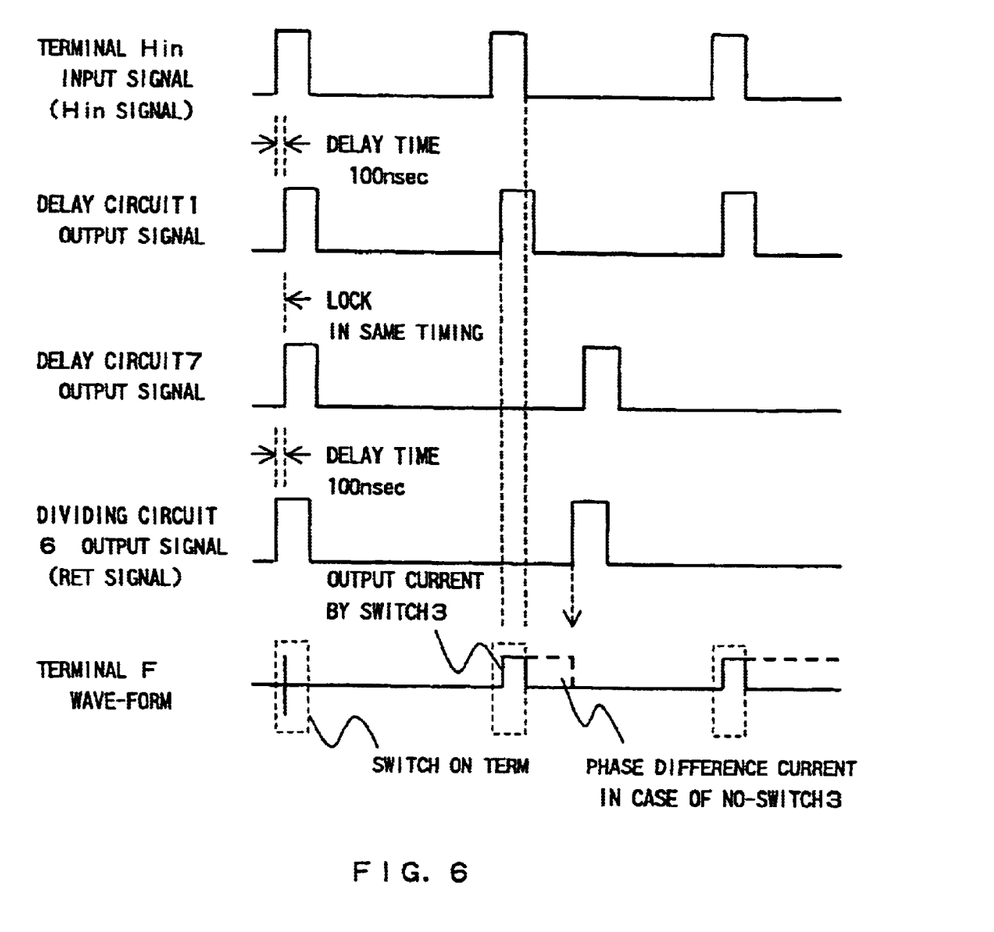
FIG. 6 shows a time-chart of a condition of such case that an Hin signal frequency has suddenly increased in FIG. 3.

Referring to FIGS. 3 and 6, a case of increase of the Hin signal frequency will be described below. The figures show the condition in which the normal condition indicative of the coincidence of the phases has been rapidly changed to the condition indicative of the frequency of the Hin signal which became higher.

In this condition, when there is no switch, the phase difference current flows out as depicted by dash lines in figure during a term from the rising edge of the output signal of the delay circuit 1 until the rising edge of the output signal of the delay circuit 7. This term is a time from the rising edge of the Hin signal until the rising edge of the RET signal. On the other hand, when the switch is supplied, the phase difference current flows during the time, i.e., a time obtained by subtracting the delay time of 100 nsec given by the delay circuit 1 from the pulse width of the Hin signal.

That is, by providing the switch controlled by the Hin signal on the output side of the phase comparator, the rapid frequency change does not occur. This is because, even if the Hin signal appears faster than the RET signal, the time of flowing the phase difference current is only the time of the pulse width or less of the Hin signal.

Figure 7:
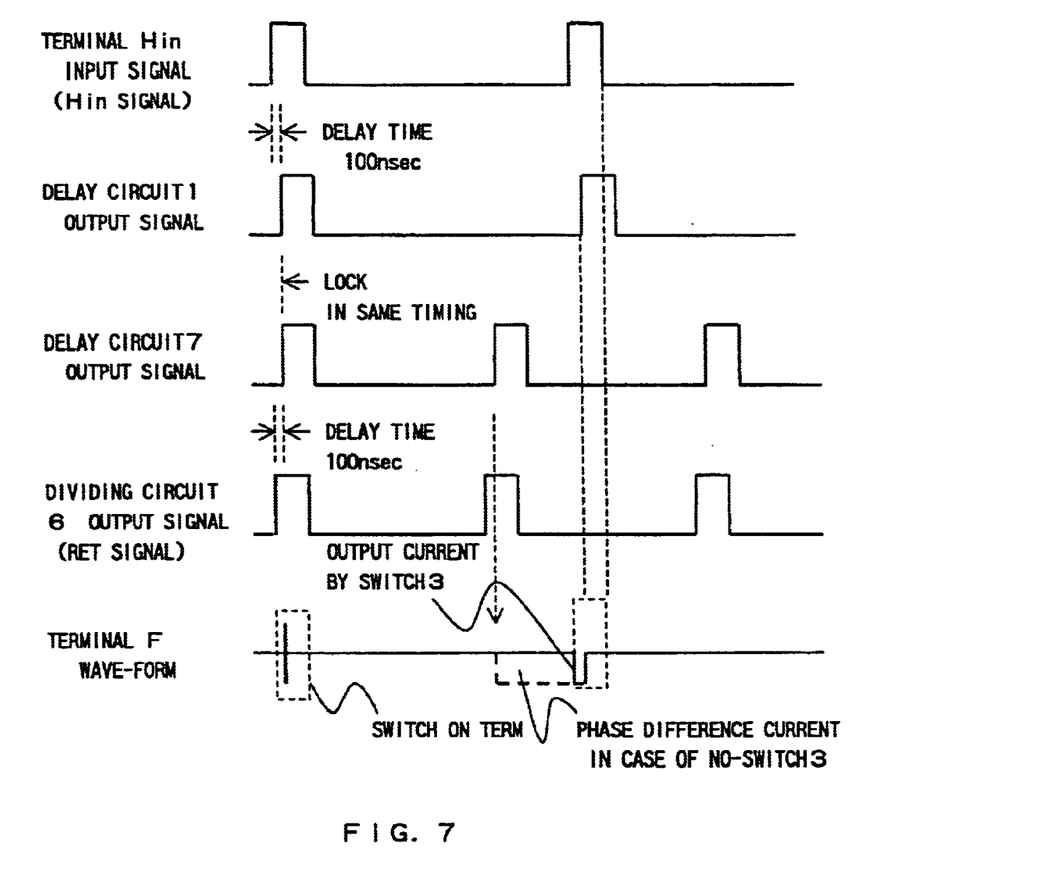
FIG. 7 shows a time-chart of a condition in case that an Hin signal frequency has suddenly decreased in FIG. 3

Referring to FIGS. 3 and 7, a case of decrease of the Hin signal frequency will be described below. The figures show the case in which the normal condition indicative of the coincidence of the phases has been rapidly changed to the condition indicative of the frequency of the Hin signal which became lower.

In this frequency condition and no switch condition, the phase difference current flows out as shown by dash lines in figure during a term from the rising edge of the output signal of the delay circuit 7 until the rising edge of the output signal of the delay circuit 1. This term is a time from the rising edge of the RET signal until the rising edge of the Hin signal. On the other hand, when a switch is supplied, a time of flowing the phase difference current is obtained only by the delay time 100 nsec given by the delay circuit 1 from the rising edge of the Hin signal. In this case, a time lag occurs on the occasion of pulling the phase difference current as the phase difference. However, it is only a level to be no problem.

That is, by reason that a switch to obtain the on/off control by the Hin signal is supplied on the output side of the phase comparator, the rapid frequency change in the VCO does not occur, This is because, even if the Hin signal appears later than the RET signal, the time of flow of the phase difference current from the switch is only the delay time 100 nsec given by the delay circuit 1.

According to this invention, the PLL circuit described above is capable of avoiding any rapid change of frequency in the VCO even if the frequency level of the input horizontal synchronization signal deteriorates less than an appointed value or disappears. The reason is that a switch to be on/off controlled by the input horizontal synchronized (Hin) signal is supplied on the output side of the phase comparator and the Hin signals are input to the phase comparator with a delay time given by the delay circuit.

According to this structure, the maximum supply time of the phase difference current to control oscillation frequency of the VCO is restricted by the pulse width of the Hin signal. Therefore, it is possible to avoid any rapid change of oscillation frequency of the VCO occurred by means of the continuous flow of the phase difference current. As to this result, in a case of a disappearance of the Hin signal, the phase difference current will not be supplied to the VCO and the oscillation frequency will be maintained.

In a case where the Hin signal frequency suddenly increased, the oscillation frequency may be increased with respect to the VCO by supplying the phase difference current during a pulse width or less of the Hin signal On the other case in which the Hin signal frequency us suddenly decreased, the oscillation frequency may be decreased with respect to the VCO by supplying the phase difference current during a pulse width according to the delay time of the delay circuit.

While this invention has been described in conjunction with the specific embodiment the details are intended to help the understanding and never to restrict this invention. It will readily be understood for those skilled in the art that various modifications can be made within the scope of appended claims.

For example, the dividing circuit has been described to divide the output frequency from the VCO until the same frequency with the horizontal synchronization signal, for example. However, the frequency may be any frequency, for example, with an integral multiple to be comparable in the phase comparator. The delay time of the RET signal to be outputted from the dividing circuit is given by the delay circuit. However, the delay time is capable of being different from the time to be given to the Hin signal by means of dealing with it in the inside of the phase comparator.

What is claimed is:

1. A phase-locked loop (PLL) circuit for horizontal synchronization signals comprising a voltage-controlled oscillator (VCO) and a phase comparator, wherein said phase comparator compares a phase of an input horizontal synchronization (Hin) signal with a phase of a return (RET) signal to be fed back, detects a phase difference value obtained by the above comparison, and sends the phase difference value to the VCO, said RET signal is divided from a signal output from the VCO and has a frequency divided to be synchronizable with the horizontal synchronization signal, and said PLL circuit locks the phases to maintain a synchronous condition, said PLL circuit characterized by further comprising:

a switch provided in the output side of said phase comparator and responsive to the horizontal synchronization (Hin) signal for transferring said detected phase difference value to said VCO only during a term of a pulse width of the horizontal synchronization signal when the horizontal synchronization signal is activated.

2. A PLL circuit for horizontal synchronization signals according to claim 1, characterized by further comprising a first delay circuit for receiving said horizontal synchronization signal, giving a predetermined delay time to said signal, and outputting said delayed signal to said phase comparator.

3. A PLL circuit for horizontal synchronization signals according to claim 2, characterized by further comprising a second delay circuit for receiving said RET signal, giving a same predetermined delay time as said delay time to this RET signal, and outputting said delayed RET signal to said phase comparator.

4. A phase-locked loop (PLL) circuit for a horizontal synchronization (Hin) signal comprising of a phase comparator including a charge pump circuit, a voltage-controlled oscillator (VCO), an automatic frequency control (AFC) filter, and a dividing circuit, wherein a loop circuit is structured by connecting an output of said phase comparator to said VCO and said AFC filter, connecting an output of said VCO to said dividing circuit, and connecting a return (RET) signal output from said dividing circuit to said phase comparator to input said horizontal synchronization signal, said PLL circuit characterized by further comprising:

a switch provided in the output side of said phase comparator and responsive to said Hin signal to receive and output a phase difference value between said horizontal synchronization signal and said RET signal, and for transferring a received phase difference value to said VCO only during a term of a pulse width of the horizontal synchronization signal when the horizontal synchronization signal is activated.

5. A PLL circuit for horizontal synchronization signal according to claim 4, characterized by further comprising a first delay circuit provided on an input side of said phase comparator to receive said horizontal synchronization signal, giving a predetermined delay time to said signal, and outputting said delayed signal to said phase comparator.

6. A PLL circuit for horizontal synchronization signals according to claim 5, characterized by further comprising a second delay circuit provided on an input side of said phase comparator for receiving said RET signal, giving a same predetermined delay time as said delay time to this RET signal, and outputting this delayed RET signal to said phase comparator.

* * * * *